(12) United States Patent
Alexandersen

(10) Patent No.: US 6,255,907 B1
(45) Date of Patent: Jul. 3, 2001

(54) POWER AMPLIFIER

(76) Inventor: Rune Olaf Alexandersen, Johan Castbergsvei 4, Oslo (NO), N-0673

( * ) Notice: Subject to any disclaimer, the term of this patent is extended or adjusted under 35 U.S.C. 154(b) by 0 days.

(21) Appl. No.: 09/230,129
(22) PCT Filed: Jul. 18, 1997
(86) PCT No.: PCT/NO97/00187
 § 371 Date: Apr. 2, 1999
 § 102(e) Date: Apr. 2, 1999
(87) PCT Pub. No.: WO98/05119
 PCT Pub. Date: Feb. 5, 1998

(30) Foreign Application Priority Data

Jul. 22, 1996 (NO) ................................................ 963054

(51) Int. Cl.$^7$ .................................................. H03F 3/30
(52) U.S. Cl. ................................... 330/146; 330/207 A
(58) Field of Search ............................ 330/146, 207 A, 330/251

(56) References Cited

U.S. PATENT DOCUMENTS

| | | | |
|---|---|---|---|
| 3,808,545 | 4/1974 | Stanley | 330/30 |
| 3,983,502 | * 9/1976 | Wheatley et al. | 330/146 |
| 4,384,258 | * 5/1983 | Coles | 330/146 |
| 4,611,180 | * 9/1986 | Stanley | 330/146 |
| 5,179,352 | 1/1993 | Inohana | 330/85 |
| 5,402,084 | 3/1995 | Freuler et al. | 330/146 |
| 5,825,248 | * 10/1998 | Ozawa | 330/146 |

* cited by examiner

Primary Examiner—Benny Lee
Assistant Examiner—Khanh Van Nguyen
(74) Attorney, Agent, or Firm—Howrey Simon Arnold & White; Carter J. White; Dean Lechtenberger

(57) ABSTRACT

A power amplifier designed for delivering high power to a load (LOAD) comprises an input stage (A1) that converts an input voltage ($u_1$) to a current signal ($i_{in}$) which is applied to an end stage comprising a current amplifier stage (A3, PA1, PA2) and a bypass-resistor (R). The output terminal (7) of the current amplifier stage is connected to earth, and the current supply (PS1, PS2) is arranged floating relative to signal earth, so that the power current signal through the load (LOAD) also passes through the current supply (PS1 or PS2). A correction amplifier (A2) is preferably connected so as to measure the voltage across the end stage (A3, PA1, PA2) and provide a correction current ($i_{korr}$) to balance the voltage difference across the current amplifier stage and remove the effect of non-linearities in the current amplifier stage.

9 Claims, 2 Drawing Sheets

POWER AMPLIFIER

This application is the National Phase entry of Patent Cooperation Treaty International Application No. PCT/NO 97/00187, filed on Jul. 22, 1996 which designates the U.S. and which claims priority of Norway Patent Application No. NO963054, filed Jul. 22, 1996.

BACKGROUND OF THE INVENTION

The present invention relates to a power amplifier more particularly the invention is primarily intended for use when delivering high output power in a frequency range 0 to 100 kHz, i.e. power without upper limit, however often in a range 50 to 2000 W, for driving resistive and reactive loads like loudspeakers, motors and other transducer types.

Related art is known from U.S. Pat. No. 3,808,545, U.S. Pat. No. 4,611,180, U.S. Pat. No. 5,179,352 and GB 1,584, 941. Among these, particularly U.S. Pat. No. 5,179,352, however partially also GB 1,584,941, relate to a signal correction technique similar to a technique which is also utilized in embodiments of the present invention. U.S. Pat. No. 3,808,545 relates to a power amplifier which exhibits circuitry having features which are also utilized in embodiments of the power amplifier in accordance with the present invention, with a bridge connection and grounding of the output terminal of the output amplifier stage.

The more usual power amplifier constructions consist of:

An input stage.

A voltage amplifier stage.

A current amplifier stage.

The task of the input stage is usually to change the operating point of the signals from around ground to around one or both of the supply voltages.

The voltage amplifier stage is intended to increase the signal voltage to a level that can provide a full output from the current amplifier stage.

The current amplifier stage usually has a voltage gain somewhat less than 1, and a current gain that is sufficient to isolate the load from the voltage amplifier stage.

When high power is desirable, one should use a higher supply voltage for the voltage amplifier stage than for the current amplifier stage, to be able to get the highest possible power from the current supply for this stage. (The voltage amplifier stage must be able to drive the current amplifier stage into saturation.) This puts restrictions on the input stage, in which one either has to choose components in accordance with their ability to withstand voltage, instead of e.g. their noise characteristics, or one has to increase complexity by e.g. connecting components in series.

Great demands are also made on the voltage amplifier stage. The transistors in this stage must stand up to the full supply voltage, and since this stage is critical as regards the linearity of the amplifier, such a large current will often run through it, that these transistors will heat up and require local cooling. This may have the effect that the product is thermally more unstable, and it may also have an unfortunate influence on the product lifetime.

SUMMARY OF THE INVENTION

The present invention has been conceived to remedy the above mentioned drawbacks. This is achieved by providing a power amplifier comprising a current supply circuitry including more than one power supply, an input stage including a transconductance amplifier, and an output stage including a second transconductance amplifier and more than one power converters for delivering power to a load. The load is connected to the output of said output stage by a proximal load terminal which is signal grounded and additionally the load has a distal load terminal. More specifically, the input stage is terminated by a transconductance amplifier for converting an input signal voltage ($U_i$) to a current signal ($I_{in}$) to the signal input of the output stage. A bypass resistor is connected between the signal input of the output stage and the distal load terminal. The output stage is comprised of a current amplifier, including a transconductance amplifier and two power converters, the combination of which delivers a power current signal to the load. The bypass resistor converts the current signal ($I_{in}$) to a voltage signal (V) which substantially constitutes the power voltage signal for the load. The output stage and the bypass resistor thus constitute a combined current amplification and voltage amplification stage. The current supply circuitry for the output stage is arranged as a floating supply and between the distal load terminal and the output stage so that the power current signal passes through said current supply circuitry. In the present embodiment, the current supply circuitry includes more than one power supplies and the output stage includes a transconductance amplifier and more than one power converters. Further advantageous embodiments of the power amplifier in accordance with the invention is achieved by adding the features disclosured herein.

The invention is believed to provide the following advantages in comparison with previously known power amplifiers:

A low supply voltage for all stages up to the current amplifier stage, has the effect that all components may be selected in accordance with their small signal characteristics, such as signal/noise ratio, bandwidth and temperature stability.

A low power dissipation in the same components leads to increased reliability and thermal stability.

A lower distortion is achieved, since there are no transistors with a large voltage swing in the stages up to the current amplifier stage. (These will result in distortion due to voltage dependent capacitances.)

Fewer components result in a lower error rate and improved reliability.

It is possible to use a standardized solution: All stages up to the current amplifier stage are the same, independent of the output power, and this simplifies storage and service operations.

In most cases it is possible to ground the cooled electrode of all or half of the output transistors, which simplifies the mounting thereof, lowers the risk of errors and improves the cooling effect.

These and other features and advantages of the present invention are more fully set forth in the following description of illustrative embodiments of the invention.

BRIEF DESCRIPTION OF THE DRAWINGS

The following description is presented with reference to the accompanying drawings in which.

DESCRIPTION OF ILLUSTRATIVE EMBODIMENTS

Figure 1:
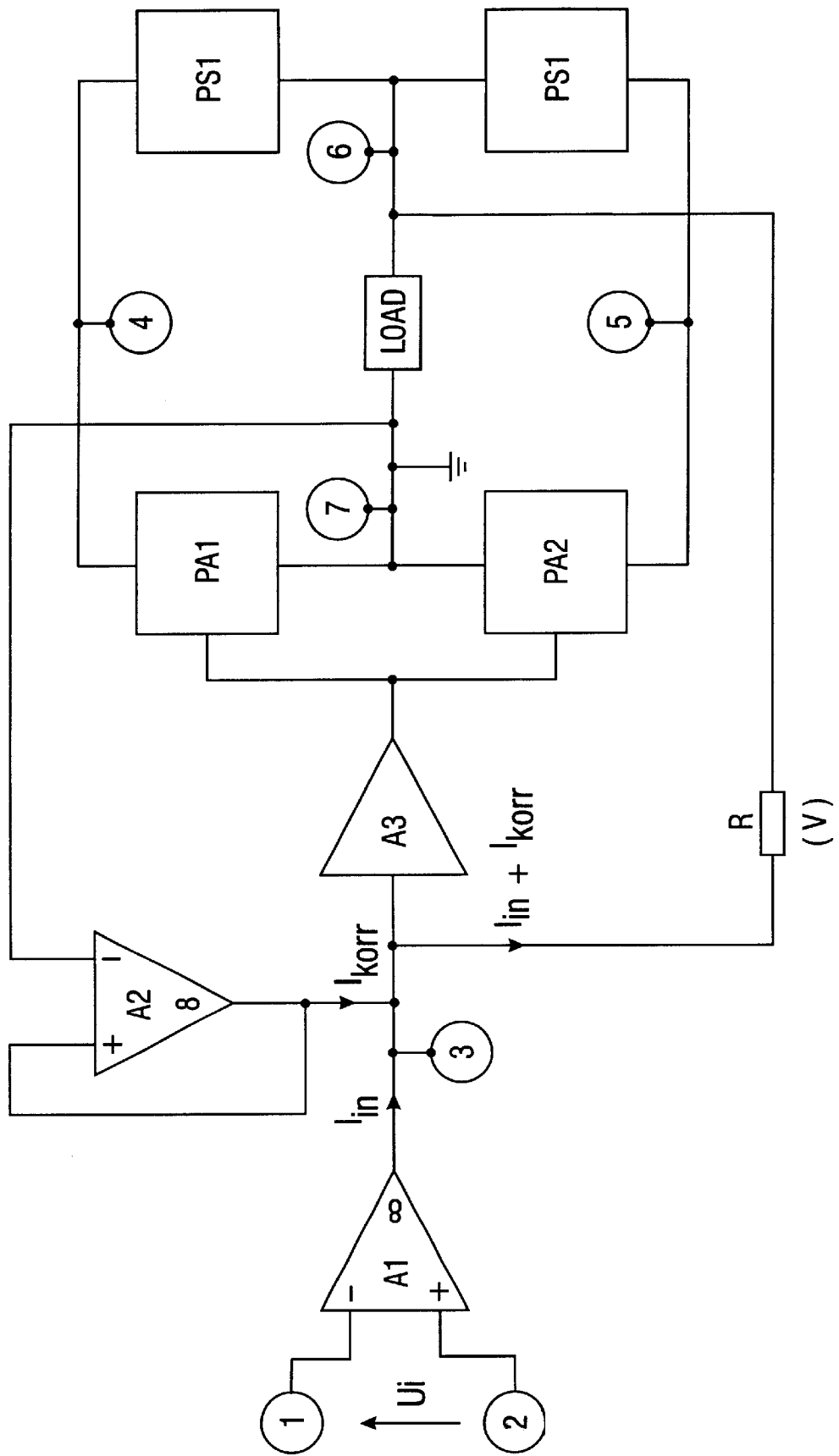
FIG. 1 shows a first embodiment of a power amplifier in accordance with the invention, in a simplified circuit diagram.

The invention shall now be explained in closer detail by going through embodiment examples, and at the same time referring to the appended drawings, where In FIG. 1, A1 and A2 are amplifier circuits with voltage input signals and current output signals. In itself A1 may represent a complete input stage, or a last amplifier stage in a more comprehensive input stage, where only this last amplifier A1 is shown in the figure. Thus, the input voltage $U_i$ results in an output signal from amplifier A1 which is the signal current $I_{in}$ in position 3 in the circuit diagram. In principle it is possible to utilize the circuit without the correction amplifier A2, but this will require that the end stage consisting of A3, PA1 and PA2, is "perfect" in the sense that the voltage drop between position 3 and position 7 in the circuit diagram is equal to zero. In a practical case, there will be a voltage difference between positions 3 and 7, and the task of the amplifier A2 is to make corrections in this respect.

A3 is an amplifier having unity voltage gain, high input impedance and low output impedance. The high input impedance of A3 causes the current signal $I_{in}$, possibly supplemented with a correction current signal $I_{korr}$ from amplifier A2, to flow through resistor R (bypass resistor), voltage V being developed across this resistor.

PA1 and PA2 are power converters, possibly consisting of three or more power transistors (or tubes), and they require an input signal between 0.5 and 12 volts peak voltage to provide maximum output current, all depending on what configuration and which kind of transistors is used.

PS1 and PS2 are similar voltage supplies arranged floatingly in relation to signal earth.

A voltage signal $U_i$ on input terminals 1, 2 of A1 will provide a current signal $I_{in}$ which will set up a voltage signal V across the bypass resistor R (using the non-grounded terminal 6 of the load as a zero point). This leads to an input voltage for A3 and a current in PA1 or PA2. This current will pass through current supply PS1 or PS2, to the load LOAD and flow therethrough. This current will provide a voltage across the load which is equal to the voltage V across resistor R, except for the input voltage of PA1 and PA2. Since this voltage varies in a non-linear manner with the output current, distortion will be caused. In order to compensate for this effect, the voltage signal is measured at the input of A3 by means of the correction amplifier A2. The correction amplifier A2 delivers a current signal $I_{korr}$ to the resistor R, which establishes a voltage thereacross equal to the input voltage present at any moment for A3 (which input voltage is equal to the voltage input to PA1 and PA2). In order to make this work, the correction amplifier A2 must have a transconductance g equal to the inverse of the resistance of bypass resistor R. (It shall be noted that the transconductance g is defined as the ratio of the amplifier output current and its input voltage.) The total voltage signal across resistor R will then be that which is caused by the input signal plus the A3 input signal. (The voltage across the resistor is the sum of the currents therethrough multiplied by the resistor resistance.)

This has the effect that the portion of the voltage signal V across bypass resistor R which has been caused by the input signal, exactly corresponds to the voltage across the load. The non-linearities in PA1 and PA2 are cancelled.

It is to be specially noted that the output terminal 7 from the end stage A3, PA1, PA2 is grounded. This requires that the voltage supply must be arranged as a floating voltage supply. This is no problem in mains-operated equipment, position 6 may e.g. represent a center position on the secondary side of a mains transformer.

One result of the feature that the end stage output 7 is grounded, is that a lower voltage swing is achieved in position 3 in the circuit diagram. If instead position 6, i.e. the other load terminal, were grounded in a conventional manner, the voltage swing in position 3, that is on the end stage input, would be the same as, or somewhat larger than the voltage swing across the load LOAD. This would make great demands on the input stage A1, since the voltage swing across the load may be more than 100 volts for large power values. (At the outset this involves power amplifiers for delivery of high power, as mentioned in the introduction.) An exemplary amplifier delivering 400 W in an 8 ohm load, gives a peak voltage of 80 volts. Then, in the conventional case, the input stage A1 would have to deliver +/−80 volts, plus margins and saturation voltages. Amplifiers using such an input stage with voltage supplies of +/−120 volts are previously known and in use.

If instead position 7 is grounded, such as in the present invention, only a standard +/−12 volts or +/−15 volts current supply is required for the input stage A1, irrespective of output power. This lessens the demands for component selection in the input amplifier A1, the reliability thereof will increase due to less heat development, etc.

The end stage amplifier A3 is in practice a voltage controlled current amplifier. Depending on the design of that amplifier, it will require from 2 to 10 volts voltage difference between positions 3 and 7 in the circuit diagram to deliver full current. This voltage will add to the voltage in position 7, and make demands on the voltage swing out from input stage A1. It is important that the bias current into A3 is so small that it will be of no importance relative to $I_{in}$. The error correction provided by correction amplifier A2 provides for equalizing the position 3 voltage to the position 7 voltage.

A special further effect of the amplifier circuit is the combination of current gain and voltage gain in one and the same end stage, by amplifying voltage via resistor R, while A3, PA1 and PA2 attend to the current amplification. Thus, in principle the input signal $U_i$ is converted to a current which in its turn is converted to a voltage across a resistor having the non-grounded terminal of the load as an end point/reference. In principle, the current amplifier stage output is also grounded, and the current through the load is controlled via the current supply. An important effect that is achieved, is that the current amplifier stage exhibits a minimum voltage swing on its input side.

Figure 2:
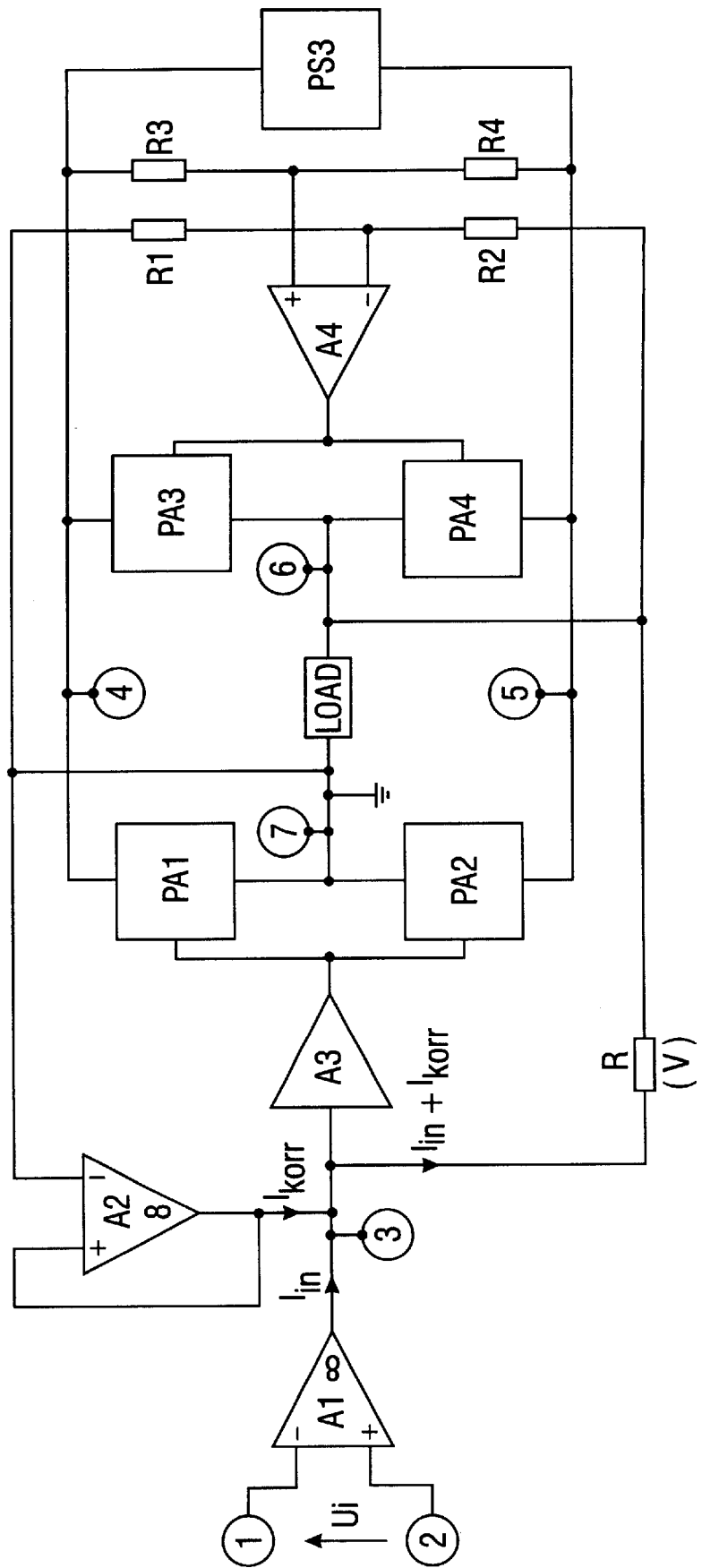
FIG. 2 shows a second embodiment of a power amplifier in accordance with the invention, in a simplified circuit diagram.

It is now referred to FIG. 2. FIG. 2 is similar to FIG. 1 except from the current supply layout, i.e. the right hand side of the diagram. The circuit solution involving A1, A2, A3, PA1 and PA2, remains unchanged. However, instead of connecting the non-grounded terminal 6 of the load to the mid-point between two identical, floating voltages, it is connected to the output from a slave amplifier A4, PA3, PA4. The slave amplifier has the task to utilize the full voltage potential of the current supply unit PS3. It is organized as a very simple feedback amplifier with a voltage amplifier stage A4 and power stages PA3 and PA4, configured almost like a mirror image of the end stage A3, PA1, PA2. The slave amplifier input is referred to the half of the voltage across the current supply unit PS3, by means of two identical resistors, R3 and R4. The gain is given by the resistance of resistors R1 and R2, according to the formula $$A=1+R2/R2.$$

The slave amplifier input signal is the movement of the current supply unit in relation to earth, measured via R3 and R4. The slave stage gain is often adjusted to somewhat above 2, as it is desirable that this stage is saturated only for large signal amplitudes, to utilize as well as possible the voltage of the current supply unit. Voltage clipping or harmonic distortion in the slave stage will not result in increased distortion of the output signal, since this lies outside the reference for the main amplifier A3, PA1, PA2, namely the interconnection point 6 between the resistor R and the load LOAD, and position 7 which is connected to the inverting input of A2.

The assembly of the current supply unit PS3, the four resistors R1–R4, the voltage amplifier A4 and the slave power stages PA3 and PA4 constitute an embodiment of a current supply circuitry in analogy with the current supply circuitry PS1, PS2 of FIG. 1.

In view of the above one of ordinary skill in the art should appreciate and understand that the scope of the present invention would include a power amplifier composed of a current supply circuitry (PS1, PS2), an input stage (A1) and an output stage (A3, PA1, PA2) for delivering power to a load (LOAD) having a distal load terminal and a proximal load terminal. The load is connected to the output of the output stage by a proximal load terminal (7) which is signal grounded. The input stage is terminated by a transconductance amplifier (A1) for converting an input signal voltage ($U_i$) to a current signal ($I_{in}$) to the signal input (3) of the output stage. A bypass resistor (R) is connected between the signal input (3) of the output stage (A3, PA1, PA2) and the distal load terminal (6). The output stage includes a current amplifier for delivering a power current signal to the load. The current amplifier includes a transconductance amplifier (A3) connected to more than one power converters (PA1 and PA2). The bypass resistor (R) converts the current signal ($I_{in}$) to a voltage signal (V) which substantially constitutes the power voltage signal for the load. Thus the output stage and the bypass resistor constitute a combined current amplification and voltage amplification stage. The current supply circuitry for the output stage is arranged as a floating supply and is electrically connected between the distal load terminal (6) and the output stage (A3, PA1, PA2) so that the power current signal passes through the current supply circuitry (PS1, PS2).

Another illustrative embodiment of the present invention includes a power amplifier as just described in the preceding paragraph, but further including a second transconductance amplifier (A2). The second transconductance amplifier (A2) is arranged to sense the signal voltage difference (Δu) between the output (7) of the output stage and the input (3) of the output stage. This second transconductance amplifier (A2) also delivers a correction current signal ($I_{korr}$) that is proportional to the signal voltage difference, to be added to the current signal ($I_{in}$) to bring about correction of the power voltage signal (V) across the bypass resistor (R) for a deviation from the load voltage signal due to a voltage difference between the input (3) and the output (7) of the output stage. The transfer function of the second transconductance amplifier is determined by the formula $g=I_{korr}/\Delta u$ having such a value that g*R=1, R being the resistance of the bypass resistor.

In yet another illustrative embodiment of the power amplifier of the present invention the output stage includes a current amplifier (A3) having unity voltage gain, high input impedance and low output impedance. The output stage also includes two parallel power converters (PA1, PA2) receiving the same signal from the current amplifier (A3). These power converters are preferably connected in a push/pull configuration, with interconnected output constituting the output (7) of the output stage.

A further illustrative embodiment of the present invention includes a power amplifier in which each power converter (PA1, PA2) has supply of power from respective and identical voltage supplies (PS1, PS2), both voltage supplies having the distal load terminal (6) as a zero point.

The power amplifier of an illustrative embodiment of the present invention may further included an output slave stage (A4, PA3, PA4), connected with its output to the distal load terminal (6). The first amplifier (A4) of the output slave stage serves as a voltage amplifier which uses as its input signal the difference between a mid-potential for a current supply unit (PS3) for the power converters (PA1–PA4). The potential of the junction point between two resistors (R1, R2) provides a selectable voltage divider ratio for the voltage across the load (LOAD). The current supply unit (PS3) for the power converters (PA1–PA4) is connected parallel to the series connection of the two power converters (PA1, PA2) in the output stage. Parallel to the series connection of the two power converters (PA3, PA4) in the slave stage, two identical and series connected resistors (R3, R4) inserted parallel to the current supply unit (PS3) provide a mid-potential for the current supply unit (PS3). The assembly of the current supply unit (PS3), the four resistors (R1–R4), the amplifier (A4) and the slave power converters (PA3, PA4) can be seen as constituting the current supply circuitry (PS3, A4, R1–R4, PA3, PA4).

While the structures and methods of the present invention have been described in terms of illustrative and preferred embodiments, it will be apparent to those of skill in the art that variations may be applied to the what has been described herein without departing from the concept and scope of the invention. All such similar substitutes and modifications apparent to those skilled in the art are deemed to be within the scope and concept of the invention as it is set out in the following claims.

What is claimed is:

1. A power amplifier comprising current supply circuitry (PS1, PS2), an input stage (A1) and an output stage (A3, PA1, PA2) for delivering power to a load (LOAD) connected to the output of said output stage by a proximal load terminal (7) and additionally has a distal load terminal (6), wherein said input stage is terminated by a transconductance amplifier (A1) for converting an input signal voltage ($U_i$) to a current signal ($I_{in}$) to the signal input (3) of said output stage, wherein a bypass resistor (R) is connected between the signal input (3) of said output stage (A3, PA1, PA2) and said distal load terminal (6), wherein said proximal load terminal (7) is signal grounded, wherein said output stage is constituted by a current amplifier (A3, PA1, PA2) for delivering a power current signal to said load (LOAD), said bypass resistor (R) converting the current signal ($I_{in}$) to a voltage signal (V) which substantially constitutes the power voltage signal for the load, said output stage and said bypass resistor thus constituting a combined current amplification and voltage amplification stage, and wherein said current supply circuitry (PS1, PS2) for the output stage is arranged as a floating supply and between the distal load terminal (6) and the output stage (A3, PA1, PA2) so that the power current signal passes through said current supply circuitry (PS1, PS2).

2. The power amplifier of claim 1, further comprising a second transconductance amplifier (A2), wherein said second transconductance amplifier (A2) is arranged to sense the signal voltage difference (Δu) between the output (7) of said output stage and the input (3) thereof, and to deliver a correction current signal ($I_{korr}$) that is proportional to said signal voltage difference, to be added to said current signal ($I_{in}$) to bring about correction of the power voltage signal (V) across said bypass resistor (R) for a deviation from the load voltage signal due to a voltage difference between the input (3) and the output (7) of said output stage, said second transconductance amplifier transfer function $g=I_{korr}/\Delta u$ having such a value that $g*R=1$, R being the resistance of said bypass resistor.

3. The power amplifier of claim 2, wherein said output stage comprises a current amplifier (A3) having unity voltage gain, high input impedance and low output impedance, and thereafter two parallel power converters (PA1, PA2) receiving the same signal from said current amplifier (A3) and being connected in a push/pull configuration, with interconnected output constituting the output (7) of said output stage.

4. The power amplifier of claim 3, wherein each power converter (PA1, PA2) has supply of power from respective and identical voltage supplies (PS1, PS2), both voltage supplies having the distal load terminal (6) as a zero point.

5. The power amplifier of claim 3, further comprising an output slave stage (A4, PA3, PA4), wherein said output slave stage is connected with its output to the distal load terminal (6) and wherein a first amplifier (A4) is a voltage amplifier which uses as its input signal the difference between a mid-potential for a current supply unit (PS3) for the power converters (PA1–PA4), and the potential of the junction point between two resistors (R1, R2) which provide a selectable voltage divider ratio for the voltage across said load (LOAD), and that the current supply unit (PS3) for the power converters (PA1–PA4) is connected parallel to the series connection of the two power converters (PA1, PA2) in the output stage, and additionally parallel to the series connection of the two power converters (PA3, PA4) in the slave stage, two identical and series connected resistors (R3, R4) inserted parallel to said current supply unit (PS3) providing said mid-potential for the current supply unit (PS3), the assembly of said current supply unit (PS3), said four resistors (R1–R4), said amplifier (A4) and said slave power converters (PA3, PA4) constituting said current supply circuitry (PS3, A4, R1–R4, PA3, PA4).

6. A power amplifier, comprising:

an input stage for converting an input signal voltage to a current signal;

proximal and distal load terminals for coupling a load to the power amplifier, the proximal load terminal being signal grounded;

an output stage including a current amplifier, the output stage having a signal input terminal for receiving the current signal from the input stage, the output stage being operable to deliver a power current signal to the proximal load terminal;

a bypass resistor connected between the signal input terminal of the output stage and the distal load terminal, the bypass resistor converting the current signal from the input stage to a voltage signal that substantially constitutes a power voltage signal for the load; and a floating current supply connected between the distal load terminal and the output stage such that the power current signal from the output stage passes through the floating current supply.

7. The power amplifier of claim 6 further comprising:

a second transconductance amplifier, the second transconductance amplifier being arranged to sense the signal voltage difference ($\Delta u$) between the output of the output stage and the input of the output stage, the second transconductance amplifier delivering a correction current signal ($I_{korr}$) that is proportional to the signal voltage difference, where the correction current signal is added to the current signal ($I_{in}$) so as to correct the power voltage signal across the bypass resistor (R) for a deviation from the load voltage signal due to a voltage difference between the input and the output of the output stage, the second transconductance amplifier having a transfer function $g=I_{korr}/\Delta u$ having such a value that $g*R=1$, R being the resistance of the bypass resistor.

8. The power amplifier of claim 7, wherein said output stage comprises a current amplifier having unity voltage gain, high input impedance and low output impedance, and thereafter more than one parallel power converters receiving the same signal from said current amplifier, the power converters being connected in a push/pull configuration, with interconnected output constituting the output of said output stage.

9. The power amplifier of claim 7, further comprising an output slave stage (A4, PA3, PA4), wherein the output slave stage is connected with its output to the distal load terminal (6) and wherein a first amplifier (A4) is a voltage amplifier which uses as its input signal the difference between a mid-potential for a current supply unit (PS3) for the power converters (PA1–PA4), and the potential of the junction point between two resistors (R1, R2) which provide a selectable voltage divider ratio for the voltage across the load (LOAD), and that the current supply unit (PS3) for the power converters (PA1–PA4) is connected parallel to the series connection of the two power converters (PA1, PA2) in the output stage, and additionally parallel to the series connection of the two power converters (PA3, PA4) in the slave stage, two identical and series connected resistors (R3, R4) inserted parallel to the current supply unit (PS3) providing the mid-potential for the current supply unit (PS3), the assembly of the current supply unit (PS3), the four resistors (R1–R4), the amplifier (A4) and the slave power converters (PA3, PA4) constituting the current supply circuitry (PS3, A4, R1–R4, PA3, PA4).

* * * * *